(12) United States Patent
Yao

(10) Patent No.: US 12,161,040 B2
(45) Date of Patent: Dec. 3, 2024

(54) DISPLAY PANEL

(71) Applicant: Wuhan China Star Optoelectronics Semiconductor Display Technology Co., Ltd., Hubei (CN)

(72) Inventor: Jiaxu Yao, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/623,278

(22) PCT Filed: Dec. 22, 2021

(86) PCT No.: PCT/CN2021/140390
§ 371 (c)(1),
(2) Date: Dec. 28, 2021

(87) PCT Pub. No.: WO2023/108747
PCT Pub. Date: Jun. 22, 2023

(65) Prior Publication Data
US 2024/0040899 A1    Feb. 1, 2024

(30) Foreign Application Priority Data

Dec. 15, 2021  (CN) .......................... 202111533067.8

(51) Int. Cl.
*H10K 59/80* (2023.01)
*H10K 59/122* (2023.01)
(Continued)

(52) U.S. Cl.
CPC ........... *H10K 59/87* (2023.02); *H10K 59/122* (2023.02); *H10K 59/38* (2023.02); *H10K 2102/351* (2023.02)

(58) Field of Classification Search
None
See application file for complete search history.

(56) References Cited

U.S. PATENT DOCUMENTS

2016/0163770 A1   6/2016  Kim et al.
2017/0162633 A1   6/2017  Kitabayashi
(Continued)

FOREIGN PATENT DOCUMENTS

CN    112670323    4/2017
CN    109119453    1/2019
(Continued)

OTHER PUBLICATIONS

International Search Report and the Written Opinion Dated Aug. 1, 2022 From the China State Intellectual Property Administration Re. Application No. PCT/CN2021/140390 and its Translation into English. (18 Pages).
(Continued)

*Primary Examiner* — Jay C Chang

(57) ABSTRACT

A display panel is provided. A display panel has a light-emitting layer including a first light-emitting pixel and a second light-emitting pixel. A first pixel opening is provided in the first light-emitting pixel. A passivation layer and the second light-emitting pixel are disposed in an overlapped manner. In addition, a height from a bottom surface of a color resist in a first light-emitting pixel region to a substrate is different from a height from a bottom surface of a color resist in a second light-emitting pixel region to the substrate, so that a light output rate and a performance in the display panel are effectively enhanced.

20 Claims, 3 Drawing Sheets

(51) Int. Cl.
*H10K 59/38* (2023.01)
*H10K 102/00* (2023.01)

(56) References Cited

U.S. PATENT DOCUMENTS

| | | | | |
|---|---|---|---|---|
| 2020/0119113 A1* | 4/2020 | Lee | ............... | G06F 3/0446 |
| 2023/0006112 A1* | 1/2023 | Kim | ............... | H01L 25/167 |

FOREIGN PATENT DOCUMENTS

| | | |
|---|---|---|
| CN | 109859644 | 6/2019 |
| CN | 110034166 | 7/2019 |
| CN | 111129092 | 5/2020 |
| CN | 111584561 | 8/2020 |
| CN | 112117312 | 12/2020 |
| CN | 113113453 | 7/2021 |
| CN | 113410276 | 9/2021 |
| CN | 113764601 | 12/2021 |

OTHER PUBLICATIONS

Notification of Office Action and Search Report Dated Jan. 28, 2023 From the State Intellectual Property Office of the People's Republic of China Re. Application No. 202111533067.8 and Its Translation Into English. (20 Pages).

\* cited by examiner

DISPLAY PANEL

RELATED APPLICATIONS

This application is a National Phase of PCT Patent Application No. PCT/CN2021/140390 having International filing date of Dec. 22, 2021, which claims the benefit of priority of Chinese Patent Application No. 202111533067.8 filed on Dec. 15, 2021. The contents of the above applications are all incorporated by reference as if fully set forth herein in their entirety.

FIELD AND BACKGROUND OF THE INVENTION

This disclosure relates to a technical field of manufacturing a display panel, and more particularly to a display panel.

With the technology development of the flexible display screen, people have higher requirements on the quality and performance of display panels and devices.

Compared with a conventional liquid crystal display (LCD), an organic light-emitting diode (OLED) device has advantages, such as the light and handy weight, the wide viewing angle, the high light-emitting efficiency and the like, and is used in many fields. With the development of OLED display products toward the large size, the high frequency and the high color properties, the higher requirements on the light-emitting rate and light-emitting performance of the OLED device have been requested. In the conventional manufacturing technology, when the formed OLED light-emitting device is obtained, a color filter (CF) is usually adopted to replace a POL-less technical solution of a conventional polarizer in order to increase the light output rate, wherein the solution decreases a thickness of a film layer of the display panel from 100 μm to several microns, decreases the light loss in the film layer, and increases the light output rate of the display panel from the original 42% to 61% to achieve the objectives of increasing the light output rate and the display effect of the panel. However, with the further requirements of the OLED devices on the light-emitting performance and display effect, the light output rate achieved by the manufacturing technology, such as POL-less, still cannot satisfy usage requirements, and the light output rate of the display panel needs to be further increased.

Therefore, it is necessary to propose solutions to the problems in the prior art.

SUMMARY OF THE INVENTION

Technical Problems

In summary, the OLED light-emitting device obtained in the prior art still has the problems of the lower light output rate of the display panel and the unideal display effect when displaying frames.

Technical Solutions

In order to solve the above-mentioned problems, an embodiment of this disclosure provides a display panel for effectively solving the problems of the lower light output rate and the unideal light-emitting effect of the display panel obtained in the prior art.

To solve the above-mentioned technical problems, embodiments of this disclosure provide technical methods to be described in the following.

A first aspect of an embodiment of this disclosure provides a display panel including:
a substrate;
a light-emitting layer disposed on one side of the substrate, the light-emitting layer including multiple light-emitting pixels, which include: a first light-emitting pixel displaying a first color, and a second light-emitting pixel displaying a second color different from the first color;
a passivation layer, which is disposed on one side of the light-emitting layer away from the substrate, and includes: a first pixel opening disposed in correspondence with the first light-emitting pixel, wherein the passivation layer and the second light-emitting pixel are disposed in an overlapped manner, and a thickness of the passivation layer ranges from 1 micron to 10 microns;
a color filter layer, which is disposed on one side of the passivation layer away from the substrate, and includes: a first color resist transmitting the first color; a second color resist transmitting the second color; and a light-obstructing part, which includes: a first light-transmission opening corresponding to the first light-emitting pixel, and a second light-transmission opening corresponding to the second light-emitting pixel, wherein the light-obstructing part is disposed on the one side of the passivation layer away from the substrate; and
a planarization layer disposed on the color filter layer;
wherein the first color resist is filled into the first pixel opening, the second color resist is filled into the second light-transmission opening, and a refractive index of the first color resist is greater than a refractive index of the passivation layer.

According to an embodiment of this disclosure, a height from a bottom surface of the first color resist to the substrate is different from a height from a bottom surface of the second color resist to the substrate.

According to an embodiment of this disclosure, the height from the bottom surface of the first color resist to the substrate is less than the height from the bottom surface of the second color resist to the substrate.

According to an embodiment of this disclosure, a central axis corresponding to the first pixel opening coincides with a central axis corresponding to the first light-transmission opening.

According to an embodiment of this disclosure, an aperture corresponding to the first pixel opening is smaller than an aperture corresponding to the first light-transmission opening.

According to an embodiment of this disclosure, a corresponding sidewall of the passivation layer in a region of the first pixel opening has an inclined angle ranging from 30° to 45°.

According to an embodiment of this disclosure, the light-obstructing part corresponding to the first light-transmission opening includes a main body part and a cover part connected to the main body part, and the cover part covers a peripheral edge of the first color resist.

A second aspect of an embodiment of this disclosure provides a display panel including:
a substrate;
a light-emitting layer disposed on one side of the substrate, the light-emitting layer including multiple light-emitting pixels, which include: a first light-emitting pixel displaying a first color, and a second light-emitting pixel displaying a second color different from the first color;

a passivation layer, which is disposed on one side of the light-emitting layer away from the substrate, and includes: a first pixel opening disposed in correspondence with the first light-emitting pixel, wherein the passivation layer and the second light-emitting pixel are disposed in an overlapped manner;

a color filter layer, which is disposed on one side of the passivation layer away from the substrate, and includes: a first color resist transmitting the first color; a second color resist transmitting the second color; and a light-obstructing part, which includes: a first light-transmission opening corresponding to the first light-emitting pixel, and a second light-transmission opening corresponding to the second light-emitting pixel, wherein the light-obstructing part is disposed on the one side of the passivation layer away from the substrate;

wherein the first color resist is filled into the first pixel opening, the second color resist is filled into the second light-transmission opening, and a refractive index of the first color resist is greater than a refractive index of the passivation layer.

According to an embodiment of this disclosure, a height from a bottom surface of the first color resist to the substrate is different from a height from a bottom surface of the second color resist to the substrate.

According to an embodiment of this disclosure, the height from the bottom surface of the first color resist to the substrate is less than the height from the bottom surface of the second color resist to the substrate.

According to an embodiment of this disclosure, a central axis corresponding to the first pixel opening coincides with a central axis corresponding to the first light-transmission opening.

According to an embodiment of this disclosure, an aperture corresponding to the first pixel opening is smaller than an aperture corresponding to the first light-transmission opening.

According to an embodiment of this disclosure, a corresponding sidewall of the passivation layer in a region of the first pixel opening has an inclined angle ranging from 30° to 45°.

According to an embodiment of this disclosure, the light-obstructing part corresponding to the first light-transmission opening includes a main body part and a cover part connected to the main body part, and the cover part covers a peripheral edge of the first color resist.

According to an embodiment of this disclosure, the light-emitting pixels further include: a third light-emitting pixel displaying a third color, wherein the first color, the second color, the third color are different from one another, and an area of the second light-emitting pixel and an area of the third light-emitting pixel are less than an area of the first light-emitting pixel, wherein the color filter layer further includes a third color resist transmitting the third color, and the light-obstructing part further includes a third light-transmission opening corresponding to the third light-emitting pixel, wherein the passivation layer and the third light-emitting pixel are further disposed in an overlapped manner, and the third color resist is filled into the third light-transmission opening.

According to an embodiment of this disclosure, a height from a bottom surface of the second color resist to the substrate and a height from a bottom surface of the third color resist to the substrate are greater than a height from a bottom surface of the first color resist to the substrate.

According to an embodiment of this disclosure, a height from a bottom surface of the second color resist to the substrate and a height from a bottom surface of the third color resist to the substrate are greater than a height from a bottom surface of the first color resist to the substrate.

According to an embodiment of this disclosure, the display panel further includes:

a touch layer, which is disposed between the light-emitting layer and the color filter layer, and includes: a touch metal layer and the passivation layer, wherein the touch metal layer includes openings disposed in correspondence with the light-emitting pixels, and the passivation layer covers the touch metal layer.

According to an embodiment of this disclosure, the light-obstructing part at an edge of the first light-transmission opening covers a portion of the first color resist, the second color resist is filled into the second light-transmission opening and covers a portion of the light-obstructing part, and the third color resist is filled into the third light-transmission opening and covers a portion of the light-obstructing part.

According to an embodiment of this disclosure, the refractive index of the first color resist or the second color resist ranges from 1.6 to 1.8, a refractive index of the passivation layer ranges from 1.0 to 1.6.

BENEFICIAL EFFECTS

In summary, useful effects of the embodiment of this disclosure will be described in the following.

The embodiment of this disclosure provides a display panel including an array substrate, a light-emitting layer, a passivation layer and a color filter layer. The light-emitting layer includes a first light-emitting pixel displaying a first color, a second light-emitting pixel displaying a second color different from the first color. The passivation layer includes a first pixel opening disposed in correspondence with the first light-emitting pixel, wherein the passivation layer and the second light-emitting pixel are disposed in an overlapped manner. The color filter layer includes: a first color resist transmitting the first color; a second color resist transmitting the second color; and a light-obstructing part, wherein the first color resist is filled into the first pixel opening, the second color resist is filled into the second light-transmission opening, and a refractive index of the first color resist is greater than a refractive index of the passivation layer. The structures of the passivation layers and the color filter layers in different sub-pixel regions are improved, so that the light output rate in the display panel is effectively increased, and the performance of the display panel is enhanced.

DESCRIPTION OF SPECIFIC EMBODIMENTS OF THE INVENTION

The descriptions of the following embodiments refer to the attached drawings for illustrating specific embodiments of this disclosure that can be implemented.

With the continuous development of the display panel manufacturing technology, people propose higher requirements on the performance and quality of the display panel. It is hoped that the manufactured display panel will have the better quality as well as the better comprehensive performance.

The technical solution of replacing a conventional polarizer with a color filter is usually adopted to the manufacturing of a high-performance display panel in the existing technology. The above-mentioned technical solution can increase a light output rate of the display panel to a certain extent. However, a light output rate and a corresponding display effect of the display panel still cannot satisfy people's requirements.

An embodiment of this disclosure provides a display panel to effectively enhance the display effect and the comprehensive performance of the display panel.

Figure 1:
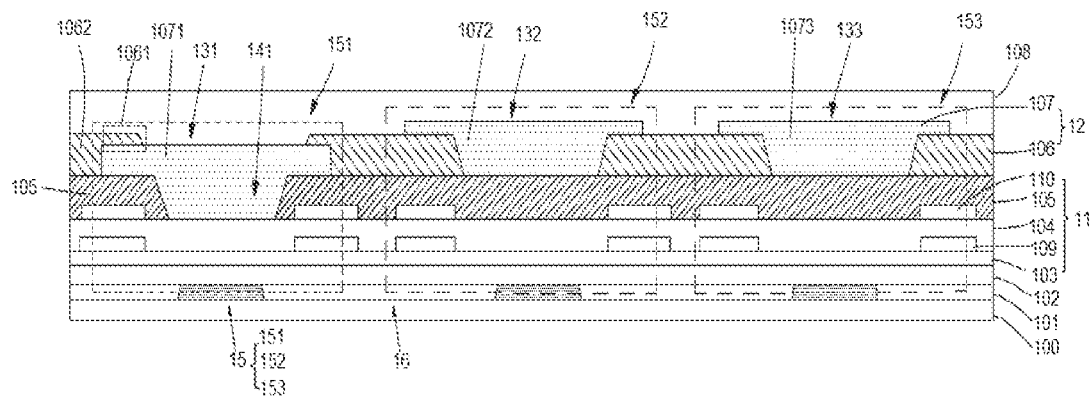
FIG. 1 is a schematic structure view showing film layers of a display panel provided by an embodiment of this disclosure.

FIG. 1 is a schematic structure view showing film layers of a display panel provided by an embodiment of this disclosure. Referring to FIG. 1, the display panel includes a substrate 100, a light-emitting layer 101, an encapsulation layer 102, a touch layer 11 and a color filter layer 12.

Specifically, the light-emitting layer 101 is disposed on the substrate 100, and the encapsulation layer 102 is disposed on the light-emitting layer 101. Meanwhile, the touch layer 11 is disposed on the encapsulation layer 102, and the color filter layer 12 is disposed on the touch layer 11. In the embodiment of this disclosure, the substrate 100 is an array substrate, and thin film transistors provided in the array substrate are used to drive the light-emitting layer 101 to emit light normally. When the light-emitting layer 101 is being provided, the light-emitting layer 101 may further include multiple light-emitting pixel regions 15. In the embodiment of this disclosure, the light-emitting pixel regions 15 may be arranged in an array and disposed on the light-emitting layer 101, and the light-emitting pixel regions 15 finally form a light-emitting display region of the display panel.

The light-emitting pixel region 15 in the embodiment of this disclosure is explained by taking a first light-emitting pixel 151, a second light-emitting pixel 152 and a third light-emitting pixel 153 as examples, wherein the different light-emitting pixel regions are separately disposed.

Further, the encapsulation layer 102 in the embodiment of this disclosure is disposed on the light-emitting layer 101, and seals the light-emitting film layer of the display panel, thereby effectively preventing external water vapor and other substances from permeating the inside of the display panel through an interlayer gap of the light-emitting layer 101, and preventing the performance and the quality of the display panel from being affected. When the encapsulation layer 102 is being provided, the encapsulation layer 102 may be configured to a superimposed structure of multiple film layers, such as a structure composed of inorganic-organic-inorganic film layer sequentially superimposed, thereby effectively enhancing the package effect of the encapsulation layer 102.

Preferably, the touch layer 11 is further disposed on the encapsulation layer 102 to implement the touch operation of the display panel. In the embodiment of this disclosure, the touch layer 11 is disposed between the light-emitting layer 101 and the color filter layer 12. The film layer structure of the touch layer 11 is improved to achieve the effect of increasing the light output rate of the display panel.

Specifically, a passivation layer 105 may further be disposed on the touch layer 11, or the passivation layer 105 is directly disposed on other film layers of the touch layer 11 to form the touch layer 11 together with the other film layers. The two structures corresponding to the above-mentioned passivation layers are substantially the same. Therefore, the touch layer 11 including the passivation layer 105 is taken as an example to be explained in the embodiment of this disclosure. Specifically, the touch layer 11 includes a first inorganic insulating layer 103, a second inorganic insulating layer 104 and the passivation layer 105. The first inorganic insulating layer 103 is disposed on the encapsulation layer 102, and the second inorganic insulating layer 104 is disposed on the first inorganic insulating layer 103. Meanwhile, the passivation layer 105 is disposed on the second inorganic insulating layer 104.

In the embodiment of this disclosure, the touch layer 11 is further provided with a touch metal layer, such as a touch electrode layer. Specifically, the touch electrode layer is disposed in a non-light-emitting pixel region 16 of the display panel. For example, the touch electrode layer surrounds the light-emitting pixel corresponding to the light-emitting pixel region, thereby preventing the touch electrode layer from obstructing the light outputted from the light-emitting layer 101. In the embodiment of this disclosure, the touch electrode layer may include a first touch electrode layer 109 and a second touch electrode layer 110. The first touch electrode layer 109 and the second touch electrode layer 110 may be disposed in different film layers. For example, the first touch electrode layer 109 is disposed on the first inorganic insulating layer 103, the second touch electrode layer 110 is disposed on the second inorganic insulating layer 104, the second inorganic insulating layer 104 covers the first touch electrode layer 109, and the passivation layer 105 covers the second touch electrode layer 110. In the embodiment of this disclosure, the touch electrode layer may be a mesh hollow structure disposed on the corresponding film layer, thereby enhancing the touch effect of the touch layer in the display panel.

Further, when the passivation layer 105 in the touch layer 11 is being provided in the embodiment of this disclosure, an opening is formed on the passivation layer 105 to form a pixel opening 141 on the passivation layer 105. Specifically, the pixel opening 141 is formed on the passivation layer 105 at a position corresponding to the first light-emitting pixel 151, and the pixel opening 141 is disposed between adjacent parts of the second touch electrode layer 110. After the light-emitting layer 101 has outputted light, the light is further transmitted to the inside of the pixel opening 141.

In the embodiment of this disclosure, the corresponding cross-sectional shape of the pixel opening 141 may be configured to have a trapezoid structure or an arced structure. Preferably, the pixel opening 141 may further have other shapes of structures, and detailed descriptions thereof will be omitted herein. In the following embodiment, the trapezoid structure is taken as an example to be explained, and the trapezoid structure is configured to be an inverted trapezoid structure.

An aperture of the pixel opening 141 is not smaller than an aperture of the opening of the first light-emitting pixel 151 corresponding thereto, so that the light emitted from the light-emitting layer can completely enter the pixel opening 141.

Further, the pixel opening 141 provided by the embodiment of this disclosure can completely penetrate through the passivation layer 105 and expose the second inorganic insulating layer 104.

When the trapezoidal cross-section corresponding to the pixel opening 141 is being configured in the embodiment of this disclosure, a side surface corresponding to the trapezoidal cross-section is away from a center of the pixel opening 141, and is configured to be inclined, so that a tilt angle is formed between a sidewall of the passivation layer 105 corresponding to the trapezoidal cross-section and a surface of the second inorganic insulating layer 104, wherein the tilt angle is the inclined angle of the sidewall of the passivation layer 105. In the embodiment of this disclosure, the inclined angle is configured to range from 30° to 45°, thereby guaranteeing the best output effect of light and effectively increasing the light output rate of the display panel.

Further, the cross-sectional shape of the pixel opening 141 in the embodiment of this disclosure may further be configured to be arced or semi-circular. When the light of the light-emitting layer enters the pixel opening 141, refraction occurs at the film layer junction corresponding to the pixel opening 141 to effectively increase the incident light amount to the pixel opening 141. Preferably, in order to decrease the thickness of each film layer in the embodiment of this disclosure, the thickness of the passivation layer 105 is configured to range from 1 micron to 10 microns.

In the embodiment of this disclosure, when the pixel opening 141 is being configured, it is possible to configure the pixel opening 141 only at a position corresponding to the first light-emitting pixel 151, or to configure the pixel opening 141 at a position corresponding to the third light-emitting pixel 153. By configuring the pixel opening at the position of two different colors of light-emitting pixel regions in one light-emitting pixel unit and not configuring the pixel opening in other light-emitting pixel regions, the precise regulation of the output rate and the light-emitting effect of the panel light can be implemented accordingly.

Further, in the embodiment of this disclosure, the color filter layer 12 is further disposed on the touch layer 11 to replace the conventional polarizer structure. Specifically, the color filter layer 12 includes a light-obstructing part 106 and a color resist 107. The light-obstructing part 106 encloses multiple separately disposed sub-pixel regions on the touch layer 11. Each sub-pixel region is disposed corresponding to the different colors of light-emitting pixels. Specifically, each light-emitting pixel region includes a first light-emitting pixel 151 displaying a first color, a second light-emitting pixel 152 displaying a second color, and a third light-emitting pixel 153 displaying a third color. The first color, the second color and the third color are different from one another. In the embodiment of this disclosure, descriptions are made by taking the first color light-emitting pixel as a red light-emitting pixel, taking the second color light-emitting pixel as a blue light-emitting pixel, and taking the third color light-emitting pixel as a green light-emitting pixel as examples. In the embodiment of this disclosure, the light-obstructing part 106 is explained by taking the black matrix layer as an example.

Further, the light-obstructing part 106 further includes a first light-transmission opening 131 corresponding to the first light-emitting pixel 151, a second light-transmission opening 132 corresponding to the second light-emitting pixel 152, and a third light-transmission opening 133 corresponding to the third light-emitting pixel 153.

Meanwhile, the color resist 107 in the exemplary embodiment of this disclosure includes a first color resist, a second color resist and a third color resist. Specifically, color resists having corresponding colors are further disposed in the pixel openings corresponding to the different colors of light-emitting pixels, and the color resists having different colors transmit different colors of light. In the embodiment of this disclosure, the first color resist is a red color resist 1071, the second color resist is a blue color resist 1072 and the third color resist is a green color resist 1073. The red color resist 1071 is correspondingly disposed in the region of the first pixel opening 141, and the blue color resist 1072 is correspondingly disposed in the region of a second pixel opening 142. Meanwhile, the green color resist 1073 is correspondingly disposed in the region of a third pixel opening 143.

Therefore, in the embodiment of this disclosure, a distance from a bottom surface of the red color resist 1071 corresponding to a first light-emitting pixel region to a surface of the light-emitting layer 101 is different from a distance from the blue color resist 1072 in a second light-emitting pixel region or from the green color resist 1073 in a third light-emitting pixel region to the surface of the light-emitting layer 101.

Preferably, in the above-mentioned embodiment of this disclosure, a height from the bottom surface of the color resist in the second light-emitting pixel 152 to the substrate 100 is the same as a height from the bottom surface of the color resist in the third light-emitting pixel 153 to the substrate 100. That is, the bottom surfaces of the color resists disposed in the region are disposed on the same plane, which is different from a plane on which the bottom surface of the color resist in the first light-emitting pixel 151 is disposed.

Further, it is further possible to configure the distance from the bottom surface of the color resist in the second light-emitting pixel 152 to the substrate 100 to be different from the distance from the bottom surface of the color resist in the third light-emitting pixel 153 to the substrate. For example, the distance from the bottom surface of the color resist in the third light-emitting pixel 153 to the surface of the substrate 100 is greater than the distance from the bottom surface of the color resist in the second light-emitting pixel 152 to the surface of the substrate 100, and the distances from the bottom surface of the color resist in the second light-emitting pixel 152 and the bottom surface of the color resist in the third light-emitting pixel 153 to the substrate are greater than the distance from the bottom surface of the color resist in the first light-emitting pixel 151 to the substrate 100. In this case, a height difference is formed between the height from the bottom surface of the color resist in the first light-emitting pixel region to the substrate and each of the heights from the bottom surfaces of the color resists in the second and third light-emitting pixel regions to the substrate. The height from the color resist in the first light-emitting pixel region to the substrate is denoted by D1, the height from the color resist in the second light-emitting pixel region to the substrate is denoted by D2, and the height from the color resist in the third light-emitting pixel region to the substrate is denoted by D3. Adjusting the values of D1, D2 and D3 can achieve the objective of enhancing the light output rate and the display effect of the display panel.

Figure 2:
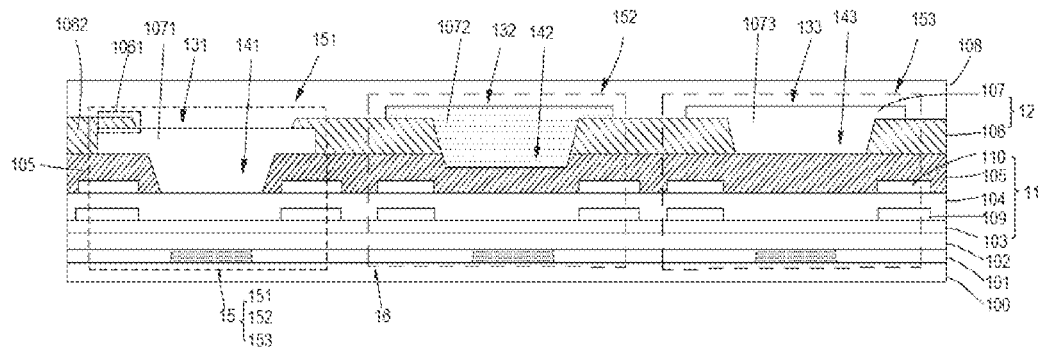
FIG. 2 is a schematic structure view showing film layers of another display panel provided by an embodiment of this disclosure.

In the embodiment of this disclosure, the distance values can be configured such that D1<D2=D3. Alternatively, please refer to FIG. 2. FIG. 2 is a schematic structure view showing film layers of another display panel provided by an embodiment of this disclosure. In FIG. 2, the distance values are configured such that D1<D2<D3. Alternatively, D1, D2 and D3 are configured to have an arithmetic relationship to implement the precise regulation to the light output rate of the display panel. When D2 is unequal to D3, it is possible to etch certain openings on the passivation layer 105 corresponding to the sub-pixel region, and then the color resists are filled into the bottom openings to obtain the different structures mentioned hereinabove.

When the first light-transmission opening 131 is being configured in the embodiment of this disclosure, a central axis of the pixel opening 141 is guaranteed to coincide with a central axis of the first light-transmission opening 131. That is, when observation is made on a top view of the display panel, the center of the pixel opening 141 and the center of the corresponding first light-transmission opening 131 are located at the same center point, so that an aperture corresponding to the first light-transmission opening 131 is greater than an aperture corresponding to the pixel opening 141.

Further, when the light-obstructing part 106 in the embodiment of this disclosure is being configured, the light-obstructing part 106 further covers the peripheral region of the red color resist 1071 in the first light-transmission opening 131. That is, the light-obstructing part 106 covers the edge of the red color resist 1071, thereby guaranteeing the optical effect of the film layer in the region.

Specifically, the light-obstructing part 106 includes a cover part 1061 and a main body part 1062, which are connected together. In addition, the cover part 1061 is disposed near one side of the first light-transmission opening 131. In the first light-transmission opening 131, the cover part 1061 of the light-obstructing part 106 packs and covers the edge of the color resist 107, while the color resist 107 corresponding to other regions of the first light-transmission opening 131 is completely exposed. In the embodiment of this disclosure, the cover part is disposed in the peripheral region of the red color resist 1071 to prevent the problem of the interference between two adjacent color resists, thereby effectively enhancing the display effect of the display panel.

In the embodiment of this disclosure, in the first light-transmission opening 131, a distance from a side surface of the light-obstructing part 106 to a center of the first light-transmission opening 131 is greater than a distance from a side surface of the passivation layer 105 to a center of the first light-transmission opening 131. That is, a certain distance is present between the side surface of the light-obstructing part 106 and an inclined surface of the passivation layer 105. In this case, the main body part 1062 of the black matrix layer and the passivation layer 105 form a platform between the edges of the pixel openings, wherein the distance of the platform is set as ranging from 1 μm to 10 μm. In addition, the width of the cover part is set as ranging from 2 μm to 5 μm in the embodiment of this disclosure. Meanwhile, when the cover part 1061 is being configured, the width of the cover part 1061 is controlled, so that the peripheral region of the cover part 1061 does not overlap with the region formed by the pixel opening. That is, the edge of the cover part 1061 does not go beyond the edge of the platform.

Further, in the second light-transmission opening 132 and the third light-transmission opening 133, the corresponding color resist is filled into the sub-pixel region, and the color resist in the region extends beyond the sub-pixel region, and covers the surface of the black matrix layer. In this case, in the peripheral regions of the second light-transmission opening 132 and the third light-transmission opening 133, the black matrix layer and the color resist form the stacked structure. In addition, at the position between the second light-transmission opening 132 and the third light-transmission opening 133, a gap is present between the blue color resist 1072 and the green color resist 1073, wherein the color resists with two different colors are not mutually connected together. Thus, the color mixing problem present between two adjacent color resists can be avoided. Further, in the regions corresponding to the second pixel opening 142 and the third pixel opening 143 in the embodiment of this disclosure, the passivation layer 105 and each of the second light-emitting pixel and the third light-emitting pixel may be disposed in an overlapped manner.

Further, when the color resist 107 and the passivation layer 105 provided by the embodiment of this disclosure are being configured, the refractive index corresponding to the color resist 107 is different from the refractive index of the passivation layer 105. Specifically, the refractive index of the color resist 107 is greater than the refractive index of the passivation layer 105. Preferably, the refractive index of the first color resist or the second color resist ranges from 1.6 to 1.8, and the refractive index of the passivation layer 105 in the touch layer ranges from 1.0 to 1.6, so that a micro array structure having different refractive indexes is formed in the region of the pixel opening 141. The micro array structure is used to effectively enhance the performance of the display panel. In the embodiment of this disclosure, the touch layers disposed in different sub-pixel regions are transparent film layers. In the touch layer, the organic layer has the maximum optical influence, and only the optical effect of the organic layer is considered.

Preferably, in the embodiment of this disclosure, the light-obstructing part 106 at the edge of the first light-transmission opening 131 covers a portion of the first color resist 1071, and the color resists in the second light-transmission opening 132 and the third light-transmission opening 133 are filled into the corresponding openings and are disposed on the upper surface of the light-obstructing part 106 to cover a portion of the light-obstructing part 106.

Further, in the embodiment of this disclosure, the light-emitting area corresponding to the second light-emitting pixel 152 and the light-emitting area corresponding to the third light-emitting pixel 153 are less than the light-emitting area corresponding to the first light-emitting pixel 151, and the second color resist corresponding to the second light-transmission opening 132 does not coincide with the third color resist disposed in the third light-transmission opening 133.

Specifically, in each of the light-emitting pixel regions, the second touch electrode layer 110 surrounds the pixel opening of the light-emitting pixel. Specifically, in the first light-emitting pixel region, the second touch electrode layer 110 surrounds the first pixel opening 141. Meanwhile, in each of the light-emitting pixel regions, the passivation layer 105 covers the second touch electrode layer 110.

Further, the embodiment of this disclosure further provides a manufacturing method of a display panel. When the display panel in the embodiment of this disclosure is being manufactured and formed, the schematic structure views corresponding to the film layers are depicted in FIGS. 3 to 7. FIGS. 3 to 7 are schematic structure views showing film layers corresponding to manufacturing processes of a display panel provided by an embodiment of this disclosure.

Figure 3:
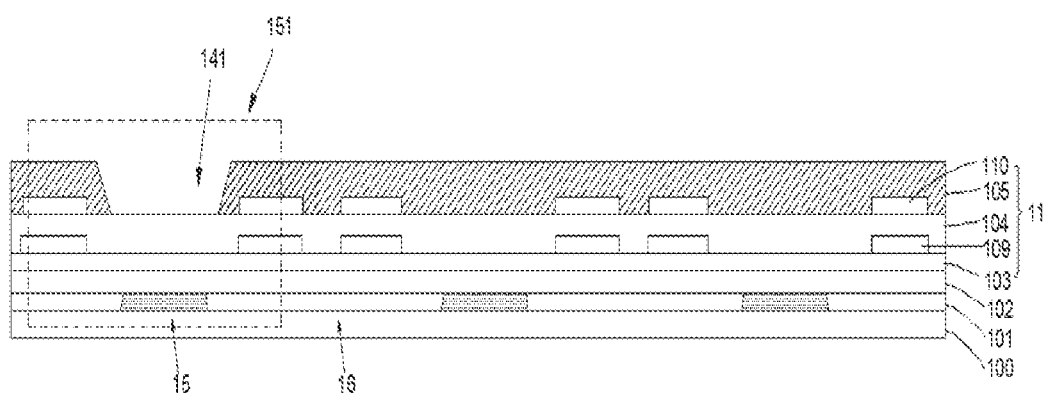
FIGS. 3, 4, 5, 6 and 7 are schematic structure views showing film layers corresponding to manufacturing processes of a display panel provided by an embodiment of this disclosure.

Referring to FIG. 3, the array substrate 100, the light-emitting layer 101 and the encapsulation layer 102 of the display panel are sequentially manufactured and formed. The light-emitting layer 101 is disposed on the array substrate 100, and the encapsulation layer 102 is disposed on the light-emitting layer 101. Meanwhile, the light-emitting layer 101 includes the light-emitting pixel region 15 and the non-light-emitting pixel region 16 adjacent to the light-emitting pixel region.

The above-mentioned functional film layer can be manufactured according to the existing manufacturing processes, and detailed descriptions thereof will be omitted herein. After being manufactured, the touch layer 11 is formed on the encapsulation layer 102. In the embodiment of this disclosure, the touch layer 11 includes multiple film layers. Specifically, the touch layer 11 includes the first inorganic insulating layer 103, the first touch electrode layer 109, the second inorganic insulating layer 104, the second touch electrode layer 110 and the passivation layer 105.

Specifically, the first inorganic insulating layer 103 is disposed on the encapsulation layer 102, the first touch electrode layer 109 is disposed on the first inorganic insulating layer 103, and the second inorganic insulating layer 104 is disposed on the first inorganic insulating layer 103 and covers the first touch electrode layer 109. Meanwhile, the passivation layer 105 is disposed on the second inorganic insulating layer 104 and covers the second touch electrode layer 110. When the touch electrode layer is being manufactured, the touch electrode layer is formed in the non-light-emitting pixel region 16.

In the embodiment of this disclosure, when the passivation layer 105 is being manufactured, whole surface coating is performed by way of spin coating, ink-jet printing or slit coating. Also, in the first light-emitting pixel 151, an opening is formed on the passivation layer 105 to form the pixel opening 141. In addition, the refractive index of the passivation layer 105 ranges from 1.4 to 1.6, and the film layer thickness of the passivation layer 105 ranges from 1 micron to 10 microns. After the manufacturing processes, the structure in FIG. 2 is formed.

Specifically, lithographing processes are performed on the organic layer corresponding to the first light-emitting pixel 151 by way of exposure and development processes. After mask etching is completed, the pixel opening 141 is formed. The cross-section of the pixel opening 141 has a trapezoid structure, wherein two hypotenuses of the trapezoid form the sidewall of the pixel opening 141. Preferably, the shape and the dimension of the pixel opening 141 and the tilt angle of the sidewall can be designed according to the actual product.

In the process of etching to form the pixel opening, it is guaranteed that the central axis of the pixel opening 141 coincides with the central axis corresponding to the light-emitting pixel region 15.

Figure 4:
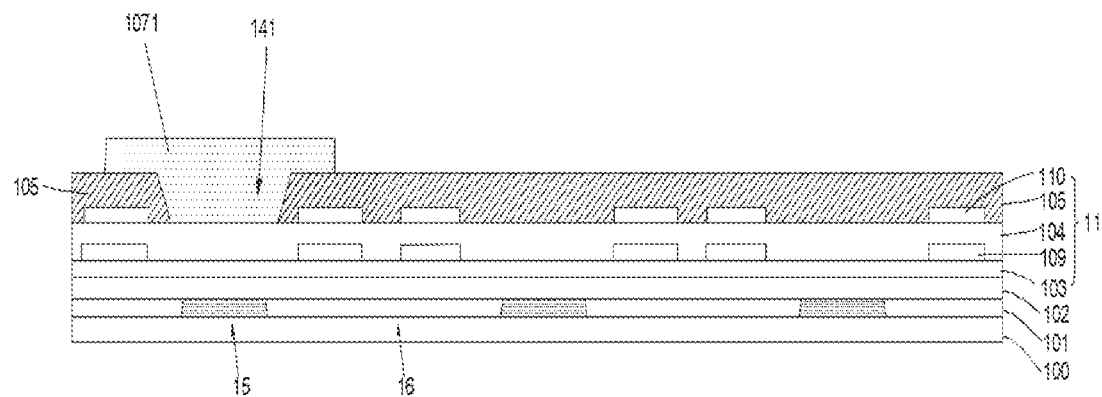

Referring to FIG. 4, after etching, the red color resist 1071 is formed on the touch layer. The red color resist 1071 is filled into the corresponding pixel opening 141 with the periphery of the red color resist 1071 extending outside the edge of the pixel opening 141.

In the embodiment of this disclosure, after the red color resist 1071 has been formed, the light-obstructing part 106 of the display panel is manufactured. When the light-obstructing part 106 is being manufactured, the light-obstructing part 106 is correspondingly disposed in the non-light-emitting pixel region 16 of the display panel, and the light-obstructing part 106 surrounds the corresponding red color resist 1071.

Figure 5:
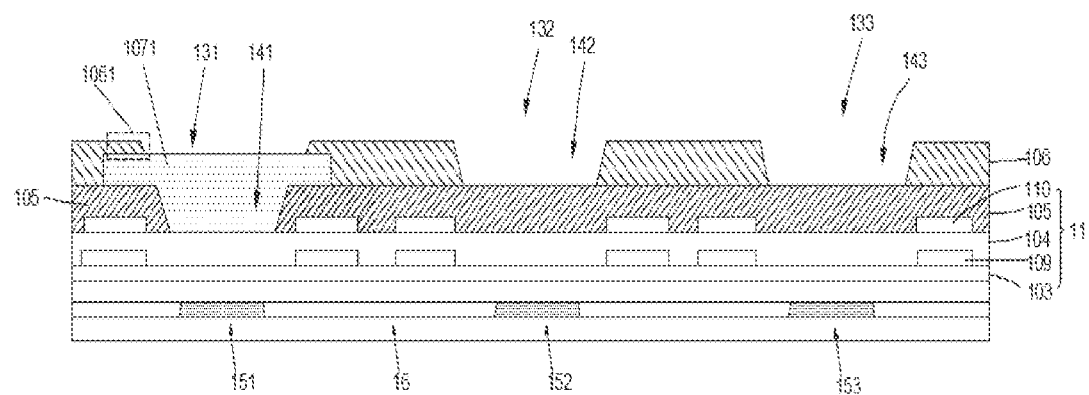
Figure 6:
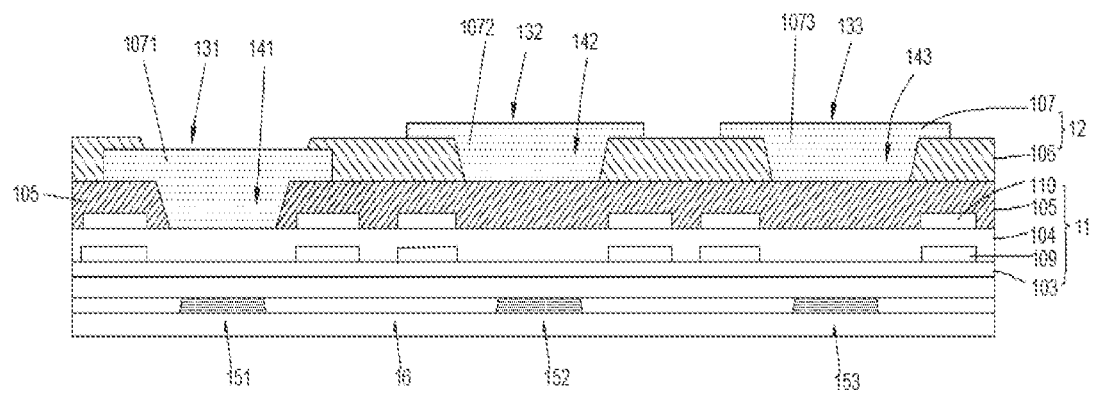

Referring to FIGS. 5 and 6, the mask etching process is then performed on the light-obstructing part 106. After the processing, the first light-transmission opening 131, the second light-transmission opening 132 and the third light-transmission opening 133 are formed in the corresponding region. In addition, the light-obstructing part 106 in the first light-transmission opening 131 further includes the cover part 1061. The cover part 1061 covers the peripheral edge of the red color resist 1071, and a bare region is formed on the red color resist 1071 and between the cover parts 1061. The light outputted from the light-emitting layer can reach other film layers through a sub-pixel region 13.

The second pixel opening 142 and the third pixel opening 143 are respectively formed in the region of the second light-emitting pixel 152 and the region of the third light-emitting pixel 153 so that the subsequent color resists can be filled therein.

After the light-obstructing part 106 has been etched in the embodiment of this disclosure, the blue color resist 1072 and the green color resist 1073 are respectively formed in the second pixel opening 142 and the third pixel opening 143. The bottom parts of the blue color resist 1072 and the green color resist 1073 are disposed on the passivation layer 105, so that the distances from the bottom parts of the blue color resist 1072 and the green color resist 1073 to the light-emitting layer are the same. In addition, the edges of the blue color resist 1072 and the green color resist 1073 at least cover a partial surface of the passivation layer 105, there is no contact between the blue color resist 1072 and the green color resist 1073, and there is no contact between the blue color resist and the red color resist.

Figure 7:
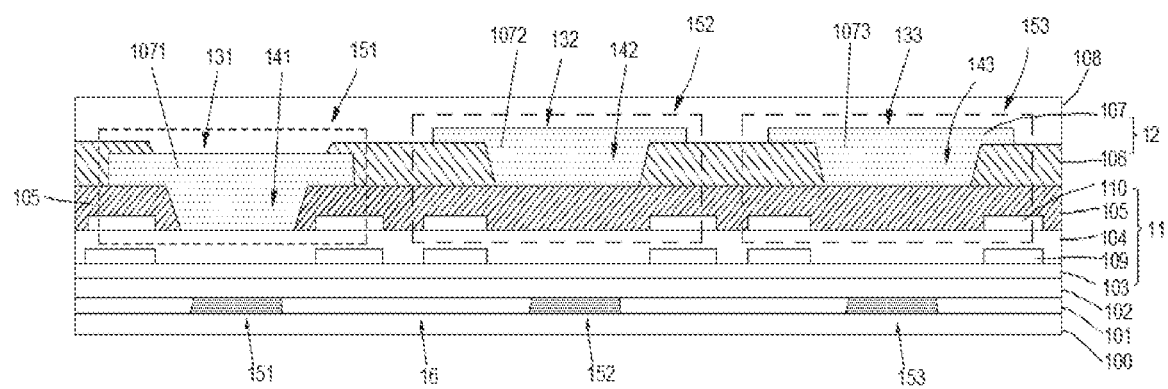

Referring to FIG. 7, the finally manufactured light-obstructing part 106 and color resist 107 form the color filter layer in the embodiment of this disclosure to thereby replace the conventional polarizer film layer and to effectively enhance the performance of the display panel. Further, after the color filter layer has been formed, a planarization layer 108 is formed on the color filter layer. When the planarization layer 108 is being formed, manufacturing is performed by way of spin coating, ink-jet printing or slit coating, wherein the film layer thickness of the planarization layer 108 ranges from 1 micron to 10 microns. While the planarization layer 108 is being formed, the planarization layer 108 is planarized to finally form the film layer structure provided by the embodiment of this disclosure. In the embodiment of this disclosure, the materials and preparing methods of other film layers are the same as those of the above-mentioned embodiment, and detailed descriptions thereof will be omitted herein. The film layer structures corresponding to the color resists having different colors in the pixel unit are improved so that the distance from the bottom part of at least one color resist to the light-emitting layer is different from the distance from other color resist to the light-emitting layer. Thus, the light-emitting effect of the light-emitting pixel can be adjusted according to the actual product, so that the display panel achieves the best display effect.

Further, the embodiment of this disclosure further provides a display device including the display panel manufactured by the manufacturing method in the embodiment of this disclosure. The display device has the better light output efficiency and display effect.

Detailed introductions have been made to the display panel provided by the embodiment of this disclosure, wherein specific examples are used in this article to illustrate the principle and implementation of this disclosure, the descriptions of the above-mentioned embodiments are only used to help readers understand the technical solution of this disclosure and its core idea. Those of ordinary skill in the art should understand that: they can still modify the technical solutions described in the foregoing embodiments, or equivalently replace some of the technical features; and these modifications or replacements do not cause the essence of the corresponding technical solutions to deviate from the scope of the technical solutions of the embodiments of this disclosure.

What is claimed is:

1. A display panel comprising:
a substrate;
a light-emitting layer disposed on one side of the substrate, the light-emitting layer comprising multiple light-emitting pixels, which comprise: a first light-emitting pixel displaying a first color, and a second light-emitting pixel displaying a second color different from the first color;
a passivation layer disposed on one side of the light-emitting layer away from the substrate, wherein the passivation layer comprises a first pixel opening disposed in correspondence with the first light-emitting pixel, the passivation layer and the second light-emitting pixel are disposed in an overlapped manner; and
a color filter layer disposed on one side of the passivation layer away from the substrate, wherein the color filter layer comprises: a first color resist transmitting the first color; a second color resist transmitting the second color; and a light-obstructing part, which comprises: a first light-transmission opening corresponding to the first light-emitting pixel, and a second light-transmission opening corresponding to the second light-emitting pixel, wherein the light-obstructing part is disposed on the one side of the passivation layer away from the substrate;
wherein the first color resist is filled into the first pixel opening, the second color resist is filled into the second light-transmission opening, and a refractive index of the first color resist is greater than a refractive index of the passivation layer; and a height from a bottommost surface of the first color resist to the substrate is less than a height from a bottommost surface of the second color resist to the substrate.

2. The display panel according to claim 1, wherein a central axis corresponding to the first pixel opening coincides with a central axis corresponding to the first light-transmission opening.

3. The display panel according to claim 2, wherein an aperture corresponding to the first pixel opening is smaller than an aperture corresponding to the first light-transmission opening.

4. The display panel according to claim 1, wherein a corresponding sidewall of the passivation layer in a region of the first pixel opening has an inclined angle ranging from 30° to 45°.

5. The display panel according to claim 1, wherein the light-obstructing part corresponding to the first light-transmission opening comprises a main body part and a cover part connected to the main body part, and the cover part covers a peripheral edge of the first color resist.

6. The display panel according to claim 1, wherein the light-emitting pixels further comprise a third light-emitting pixel displaying a third color, wherein the first color, the second color, the third color are different from one another, and an area of the second light-emitting pixel and an area of the third light-emitting pixel are less than an area of the first light-emitting pixel,
wherein the color filter layer further comprises a third color resist transmitting the third color, and the light-obstructing part further comprises a third light-transmission opening corresponding to the third light-emitting pixel,
wherein the passivation layer and the third light-emitting pixel are further disposed in an overlapped manner, and the third color resist is filled into the third light-transmission opening.

7. The display panel according to claim 6, wherein a height from a bottom surface of the second color resist to the substrate and a height from a bottom surface of the third color resist to the substrate are greater than a height from a bottom surface of the first color resist to the substrate.

8. The display panel according to claim 7, wherein the height from the bottom surface of the second color resist to the substrate is the same as the height from the bottom surface of the third color resist to the substrate.

9. The display panel according to claim 6, wherein the light-obstructing part at an edge of the first light-transmission opening covers a portion of the first color resist, the second color resist is filled into the second light-transmission opening and covers a portion of the light-obstructing part, and the third color resist is filled into the third light-transmission opening and covers a portion of the light-obstructing part.

10. The display panel according to claim 1, wherein the display panel further comprises:
a touch layer disposed between the light-emitting layer and the color filter layer, and comprises a touch metal layer and the passivation layer,
wherein the touch metal layer comprises openings disposed in correspondence with the light-emitting pixels, and the passivation layer covers the touch metal layer.

11. The display panel according to claim 1, wherein the refractive index of the first color resist or the second color resist ranges from 1.6 to 1.8, and a refractive index of the passivation layer ranges from 1.0 to 1.6.

12. The display panel according to claim 1, wherein the light-emitting pixels further comprise a third light-emitting pixel displaying a third color, the first color, the second color, the third color are different from one another, and an area of the second light-emitting pixel and an area of the third light-emitting pixel are less than an area of the first light-emitting pixel; and the color filter layer further comprises a third color resist transmitting the third color, the light-obstructing part further comprises a third light-transmission opening corresponding to the third light-emitting pixel, and the third color resist is filled into the third light-transmission opening; and
wherein both of the height from the bottommost surface of the second color resist to the substrate and a height from a bottommost surface of the third color resist to the substrate are greater than the height from the bottommost surface of the first color resist to the substrate.

13. The display panel according to claim 12, wherein the height from the bottommost surface of the second color resist to the substrate is less than or equal to the height from the bottommost surface of the third color resist to the substrate.

14. The display panel according to claim 1, wherein the light-emitting pixels further comprise a third light-emitting pixel displaying a third color, the first color, the second color, the third color are different from one another, and an area of the second light-emitting pixel and an area of the third light-emitting pixel are less than an area of the first light-emitting pixel; and the color filter layer further comprises a third color resist transmitting the third color, the light-obstructing part further comprises a third light-transmission opening corresponding to the third light-emitting pixel, and the third color resist is filled into the third light-transmission opening; and
wherein both of the height from the bottommost surface of the second color resist to the substrate and a height from a bottom surface of the third color resist to the substrate are greater than the height from the bottommost surface of the first color resist to the substrate; and the first color resist is a red color resist, the second color resist is a blue color resist, and the third color resist is a green color resist.

15. The display panel according to claim 1, further comprising a touch layer, wherein the touch layer comprises a first inorganic insulating layer, a first touch electrode layer, a second inorganic insulating layer, and a second touch electrode layer disposed in the light-emitting layer in sequence, and the passivation layer is disposed between the second inorganic insulating layer and the color filter layer and covers the second touch electrode layer; and wherein the first pixel opening penetrates through the passivation layer and expose the second inorganic insulating layer.

16. The display panel according to claim 1, further comprising a touch layer, wherein the touch layer comprises a first inorganic insulating layer, a first touch electrode layer, a second inorganic insulating layer, and a second touch electrode layer disposed in the light-emitting layer in sequence, and the passivation layer is disposed between the second inorganic insulating layer and the color filter layer and covers the second touch electrode layer; and wherein the first pixel opening penetrates through the passivation layer and expose the second inorganic insulating layer, the passivation layer further comprises a second pixel opening disposed in correspondence with the second light-emitting pixel, the second pixel opening extends into a part of the passivation layer, and the second color resist is filled into the second pixel opening and the second light-transmission opening.

17. The display panel according to claim 1, wherein the light-obstructing part comprises a cover part and a main body part connected to the cover part, the main body part covers a side surface of the first color resist, and the cover part covers a peripheral edge of an upper surface of the first color resist; and wherein a distance from a side surface of the main body part to a center of the first light-transmission opening is greater than a distance from an inner sidewall of the first pixel opening to the center of the first light-transmission opening.

18. The display panel according to claim 1, wherein a cross-sectional surface of the first pixel opening is in an inverted trapezoid shape.

19. The display panel according to claim 1, wherein the passivation layer has a thickness of 1 micron to 10 microns.

20. A display panel comprising:
a substrate;
a light-emitting layer disposed on one side of the substrate, the light-emitting layer comprising multiple light-emitting pixels, which comprise a first light-emitting pixel displaying a first color, and a second light-emitting pixel displaying a second color, and a third light-emitting pixel displaying a third color, and the first color, the second color, and the third color are different;
a passivation layer disposed on one side of the light-emitting layer away from the substrate, wherein the passivation layer comprises a first pixel opening disposed in correspondence with the first light-emitting pixel and penetrating through the passivation layer, the passivation layer and the second light-emitting pixel are disposed in an overlapped manner, and a cross-sectional surface of the first pixel opening is in an inverted trapezoid shape;
a color filter layer disposed on one side of the passivation layer away from the substrate, wherein the color filter layer comprises a first color resist transmitting the first color, a second color resist transmitting the second color, a third color resist transmitting the third color, and a light-obstructing part, the light-obstructing part comprises a first light-transmission opening corresponding to the first light-emitting pixel, a second light-transmission opening corresponding to the second light-emitting pixel, and a third light-transmission opening corresponding to the third light-emitting pixel, wherein the light-obstructing part is disposed on the one side of the passivation layer away from the substrate;
wherein the first color resist is filled into the first pixel opening, the second color resist is filled into the second light-transmission opening, and a refractive index of the first color resist is greater than a refractive index of the passivation layer; and
wherein the light-obstructing part corresponding to the first light-transmission opening comprises a main body part and a cover part connected to the main body part, and the cover part covers a peripheral edge of the first color resist; and the light-obstructing part at an edge of the first light-transmission opening covers a portion of the first color resist, the second color resist is filled into the second light-transmission opening and covers a portion of the light-obstructing part, and the third color resist is filled into the third light-transmission opening and covers a portion of the light-obstructing part; and
a height from a bottommost surface of the first color resist to the substrate is less than a height from a bottommost surface of the second color resist to the substrate.

* * * * *